US012597786B2

(12) United States Patent
Yu et al.

(10) Patent No.: US 12,597,786 B2
(45) Date of Patent: Apr. 7, 2026

(54) HIGH VOLTAGE ISOLATION USING DISCRETE NON-ISOLATED DEVICES AND ELECTRICALLY ISOLATING, THERMALLY CONDUCTIVE SUBSTRATE

(71) Applicant: North Carolina State University, Raleigh, NC (US)

(72) Inventors: Wensong Yu, Raleigh, NC (US); Dakai Wang, Raleigh, NC (US); Srdjan Miodrag Lukic, Raleigh, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 956 days.

(21) Appl. No.: 17/828,477

(22) Filed: May 31, 2022

(65) Prior Publication Data

US 2022/0385081 A1 Dec. 1, 2022

Related U.S. Application Data

(60) Provisional application No. 63/194,281, filed on May 28, 2021.

(51) Int. Cl.
*H02J 7/00* (2006.01)
*H05K 7/20* (2006.01)

(52) U.S. Cl.
CPC ........ *H02J 7/0042* (2013.01); *H02J 7/00309* (2020.01); *H05K 7/20409* (2013.01); *H05K 7/20481* (2013.01); *H05K 7/209* (2013.01)

(58) Field of Classification Search
USPC ......................... 320/106, 107, 108, 109, 110
See application file for complete search history.

(56) References Cited

FOREIGN PATENT DOCUMENTS

CN 107833885 A * 3/2018 ......... H01L 27/0629
CN 202020063105 A * 1/2020

* cited by examiner

*Primary Examiner* — Brian Ngo
(74) *Attorney, Agent, or Firm* — Thomas I Horstemeyer, LLP

(57) ABSTRACT

Various examples are provided for high voltage isolation. The isolation can be provided for discrete non-isolated devices using an electrically isolating substrate that is thermally conductive. In one example, a module includes a plurality of switching devices connected in series; one or more rubber buffer disposed between switching device pairs of the plurality of switching devices; and thermal interfaces disposed between switching devices of the switching device pairs and cooling surfaces of the module, the thermal interfaces electrically isolating the switching devices from the cooling surface. In another example, an extreme fast charger (EFC) station includes an active front end (AFE) module that includes at least one module, where the module is a half-bridge power module. The EFC station can include a dual-active-bridge (DAB) high voltage (HV) module that includes at least one module, where the module is a half-bridge power module.

20 Claims, 7 Drawing Sheets

*Si-based module*

*SiC-based module*

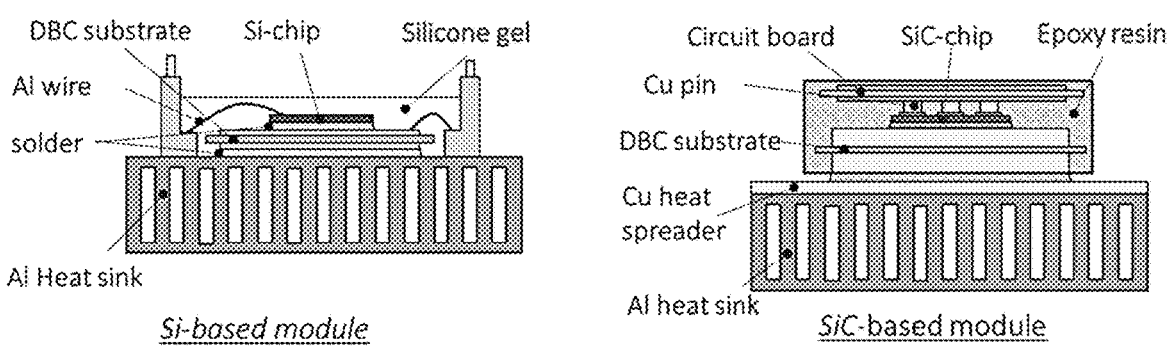
*Si-based module*
*SiC-based module*
FIG. 1
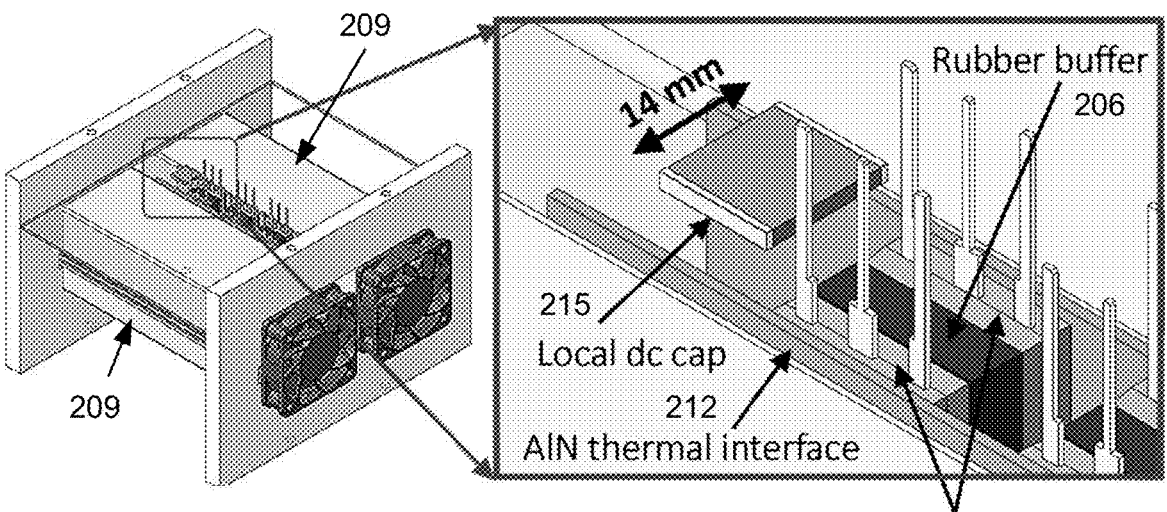
FIG. 2A
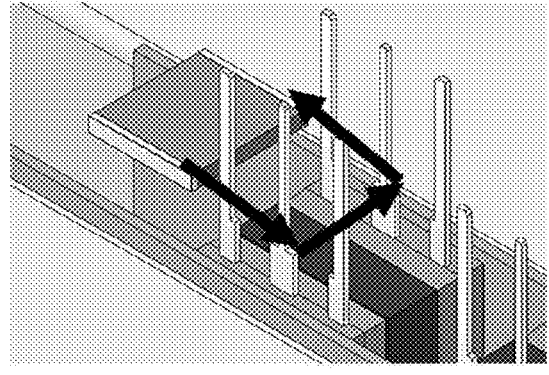
Commutation loop Low-cost discrete devices in series 203

Low cost AlN plate for high isolation
and low thermal impedance 212

209

209

Heatsink

High temperature rubber buffer 206

Metal frame for clamping the power module
218

| AFE Module | |
|---|---|
| Topology | Multilevel flying capacitor converter |
| $f_{sw}$ | 5 kHz |
| Device | C3M0016120D (16 mΩ / 1200V) |
| Flying Cap | 68 nF |

Simple passive clamping          Active gating with special deadtime

+

=

Static & dynamic
voltage balance

HIGH VOLTAGE ISOLATION USING DISCRETE NON-ISOLATED DEVICES AND ELECTRICALLY ISOLATING, THERMALLY CONDUCTIVE SUBSTRATE

CROSS REFERENCE TO RELATED APPLICATIONS

This application claims priority to, and the benefit of, U.S. provisional application entitled "Low Cost Approach to Providing High Voltage Isolation Using Discrete Non-Isolated Devices and Electrically Isolating, Thermally Conductive Substrate" having Ser. No. 63/194,281, filed May 28, 2021, which is hereby incorporated by reference in its entirety.

STATEMENT REGARDING FEDERALLY SPONSORED RESEARCH OR DEVELOPMENT

The present invention was made with United States Government support under Grant No. DE-EE0008450 awarded by the U.S. Dept. of Energy—Energy Efficiency & Renewable Energy (DOE/EERE). The United States Government has certain rights in the invention.

BACKGROUND

Typical modules include switching devices connected in parallel. Multiple semiconductor chips can be put together in a single module and connected using wire bonds. While this configuration provides a higher current capability, the voltage capability of the module is limited. Heating of the switching devices during operation complicates the ability to electrically isolate the devices.

SUMMARY

Aspects of the present disclosure are related to high voltage isolation, which can be provided for discrete non-isolated devices using an electrically isolating, thermally conductive substrate. In one aspect, among others, a module comprises a plurality of switching devices connected in series; one or more rubber buffer disposed between switching device pairs of the plurality of switching devices; and thermal interfaces disposed between switching devices of the switching device pairs and cooling surfaces of the module, the thermal interfaces electrically isolating the switching devices from the cooling surface. In one or more aspects, the thermal interfaces can comprise an aluminum nitride (AlN) sheet or plate positioned between, and in contact with, at least one switching device and an adjacent cooling surface. The AlN sheet or plate can be disposed between two or more switching devices and the adjacent cooling surface.

In various aspects, the switching devices of the switching device pairs are not gated simultaneously. Gating of the switching devices of the switching device pairs can be separated by a controlled deadtime. The cooling surfaces can be a cooling channel or a heatsink. The plurality of switching devices can comprise HV MOSFETs. The switching devices of each switching device pair can be separated by a corresponding rubber buffer. The plurality of switching devices can be coupled to a passive clamping circuit.

In another aspect, an extreme fast charger (EFC) station comprises an active front end (AFE) module comprising at least one half-bridge power module comprising: a plurality of switching devices connected in series; one or more rubber buffer disposed between switching device pairs of the plurality of switching devices; and thermal interfaces disposed between switching devices of the switching device pairs and cooling surfaces of the module, the thermal interfaces electrically isolating the switching devices from the cooling surface; a dual-active-bridge (DAB) high voltage (HV) module; a DAB transformer; and a DAB low voltage (LV) module. In one or more aspects, the AFE can comprise a cascaded-flying-capacitor multilevel AFE. The DAB HV module can comprise at least one half-bridge power module comprising: a plurality of switching devices connected in series; one or more rubber buffer disposed between switching device pairs of the plurality of switching devices; and thermal interfaces disposed between switching devices of the switching device pairs and cooling surfaces of the module, the thermal interfaces electrically isolating the switching devices from the cooling surface.

In various aspects, the thermal interfaces of the at least one half-bridge power module comprise an aluminum nitride (AlN) sheet or plate positioned between, and in contact with, at least one switching device and an adjacent cooling surface. The AlN sheet or plate can be disposed between two or more switching devices and the adjacent cooling surface. In some aspects, the switching devices of the switching device pairs are not gated simultaneously. Gating of the switching devices of the switching device pairs can be separated by a controlled deadtime. The cooling surfaces can be a cooling channel or a heatsink. The plurality of switching devices can comprise HV MOSFETs. The switching devices of each switching device pair can be separated by a corresponding rubber buffer. The plurality of switching devices can be coupled to a passive clamping circuit.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1 illustrates examples of a silicon (Si) based module and a silicon carbide (SiC) based module, in accordance with various embodiments of the present disclosure.

FIGS. 2A-2C illustrates an example of an implementation of the high voltage isolation in a module assembly such as, e.g., a half-bridge power module, in accordance with various embodiments of the present disclosure.

DETAILED DESCRIPTION

Figures 2B, 2C:
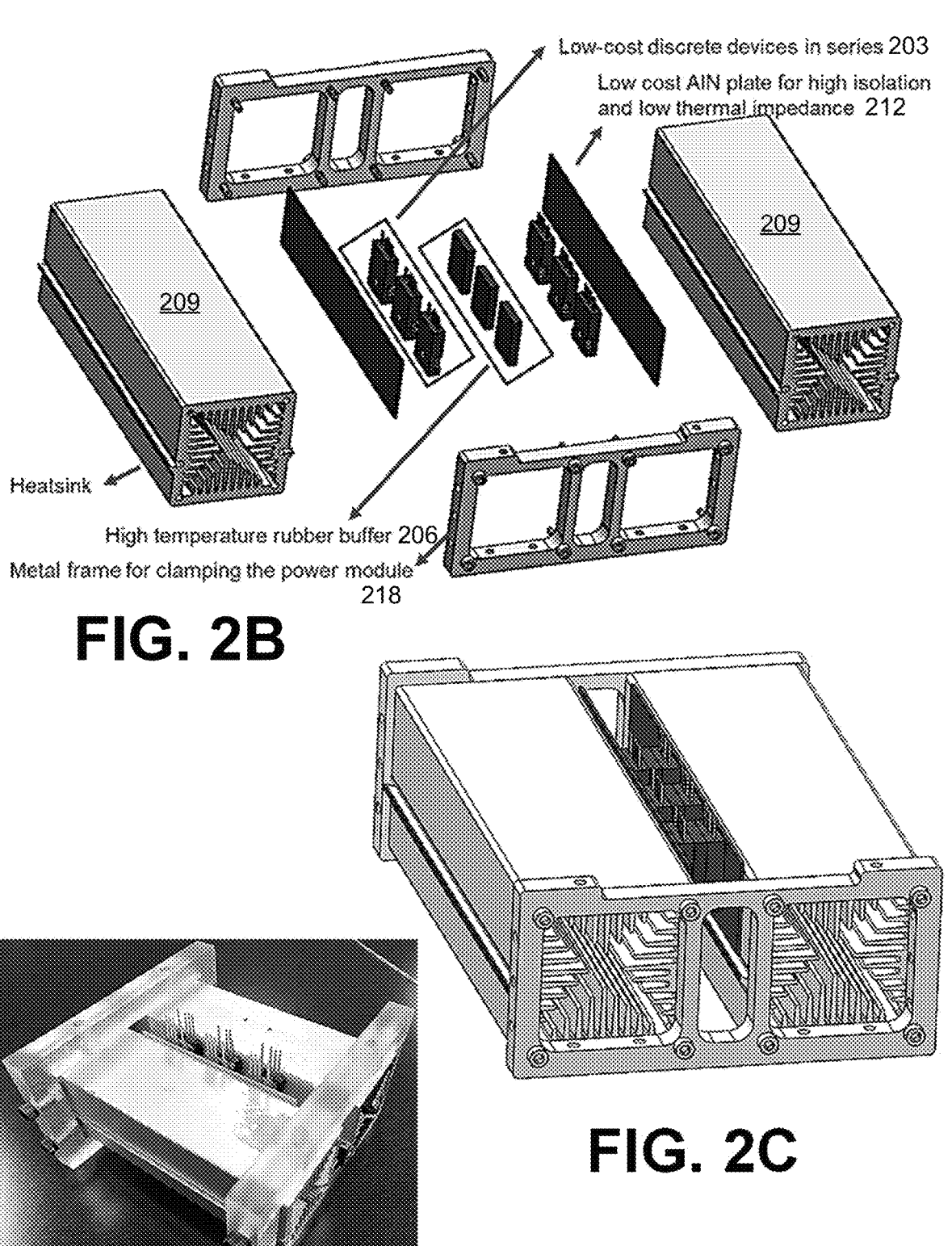

Disclosed herein are various examples related to high voltage isolation. The isolation can be provided for discrete non-isolated devices using an electrically isolating substrate that is thermally conductive. The use of such substrates can offer a low-cost approach to high voltage isolation. Reference will now be made in detail to the description of the embodiments as illustrated in the drawings, wherein like reference numbers indicate like parts throughout the several views.

In high voltage operations, multiple semiconductor chips can be put together in a single module and connected using wire bonds. FIG. 1 illustrates examples of a silicon (Si) based module and a silicon carbide (SiC) based module comprising passive aluminum (Al) heatsinks. Typically, devices are connected in parallel rather than in series. This configuration can provide a higher current capability, but not a higher voltage capability compared to a single device. The voltage capabilities can be increased by connecting the switching devices in series. The disclosed approach allows the devices to be connected as needed by the application. The external circuit can manage the current/voltage sharing among the devices for proper operation.

This technology is useful for high voltage power electronics system, for example, an electric vehicle (EV) extreme fast charging (XFC) station with direct connection to the high voltage distribution network to minimize installation and operating costs, reduce the volume and mass, and increase the energy efficiency. It is not uncommon for the cost of a module to be 2-5 times the cost of the discrete non-isolated devices. This additional cost may be attributed to the cost of the facility needed for manufacturing, the cost of the additional materials (e.g., DBC, module case, etc.) and/or other factors. The proposed approach can reduce this by using low cost discrete devices and, e.g., low cost AlN plates.

The isolation capability is controlled by the thickness of the electrically isolating, thermally conductive substrate, which can be fixed for a given module type. The disclosed approach can use, e.g., low-cost discrete devices and low-cost aluminum nitride (AlN) plates or sheets for isolation. Pairs of devices can be positioned on opposite sides of a rubber buffer and insulated from a cooling surface of, e.g., heatsink by a thermal interface of, e.g., AlN, aluminum-oxide, or others. The thickness of the rubber and/or thermal interface materials can be variable according to isolation level requirements. The isolation capability is controlled by the thickness of the electrically isolating, thermally conductive substrate. The thermal resistance from the semiconductor junction to ambient or a coolant can be lower than 0.4 degree C. per watt and the operating voltage of the devices can be up to 50 kV. The switching devices (e.g., metaloxide-semiconductor field-effect transistors (MOSFETs), such as SiC MOSFETs) can be connected in a hybrid configuration, which can offer advantages over passive and active configurations. Switching of the devices can be controlled with predefined dead-times to reduce loss and the associated cooling requirements.

Referring to FIG. 2A, shown is an example of an implementation of the high voltage isolation in a module assembly such as, e.g., a half-bridge power module. As shown in the enlarged view, the module assembly can include pairs of switching devices 203 (e.g., low cost TO-247 SiC MOS-FETs) separated from each other by one or more rubber buffer 206 and separated from the heatsinks 209 by thermal interfaces 212 (e.g., aluminum nitride (AlN) sheets or plates). The rubber buffer assembly can be optimized to provide appropriate insulation between the pair of switching devices 203. The thermal interfaces 212 provide electrical insulation from the cooling surface of the heatsinks 209 while allowing heat to be removed from the switching devices 203 during operation. AlN thermal interfaces can have a dielectric strength of 17 kV/mm and a thermal conductivity of greater than 175 W/mK, which is very close to the thermal conductivity of aluminum (205 W/mK). The low cost of AlN plates or sheets (about $13/piece) offers a good opportunity to reduce the module cost. As shown in FIG. 2A, one or more local DC capacitor 215 can also be located between the thermal interfaces 212 adjacent to the switching device pairs 203. This configuration can reduce or minimize communication loop inductance. By locating the capacitor 215 (e.g., a ceramic capacitor) adjacent to the switching devices 203 (e.g., SiC MOSFETs), the shortest communication loop can be established. High temperature rubber and the AlN sheets can ensure that sufficient insulation capability is provided.

FIG. 2B is an exploded view showing the components of the module assembly of FIG. 2A. The half-bridge can have two switching positions, with each position having three low-cost discrete switching devices connected in series as depicted in FIG. 2B. The low-cost AlN sheet or plate 212 is placed between the heatsink 209 and the discrete switching devices 203 to provide the high isolation and low thermal impedance at the same time. The isolation level depends on the thickness of the AlN sheet or plate 212 and the thickness of the rubber buffers 206. The high temperature rubber buffers 206 and the two metal frames 218 clamps the discrete non-isolated switching devices 203 between the two heatsinks 209. The mechanical strength depends on the thickness and the hardness rating of the rubber buffer 206. The rubber buffer 206 can be longer than the discrete switching devices 206 to provide longer creepage and clearance distance.

From the thermal perspective, the heatsink 209 can include a cooling channel and the low-cost AlN plate or sheet 212 can exhibit a low thermal impedance to improve the heat dissipation efficiency. FIG. 2C illustrates an example of a cooling channel extending through the heatsink 209. The cooling channel can include fins extending into the channel to maximize the heat transfer by the heatsink 209. Forced air cooling can be integrated with the heatsinks. For example, one or more cooling fan can be mounted at an end of the cooling channel as shown in FIG. 2A. The cooling fan can be controlled to adjust airflow through the cooling channel to maintain an appropriate operating temperature of the switching devices 203.

Figure 3A:
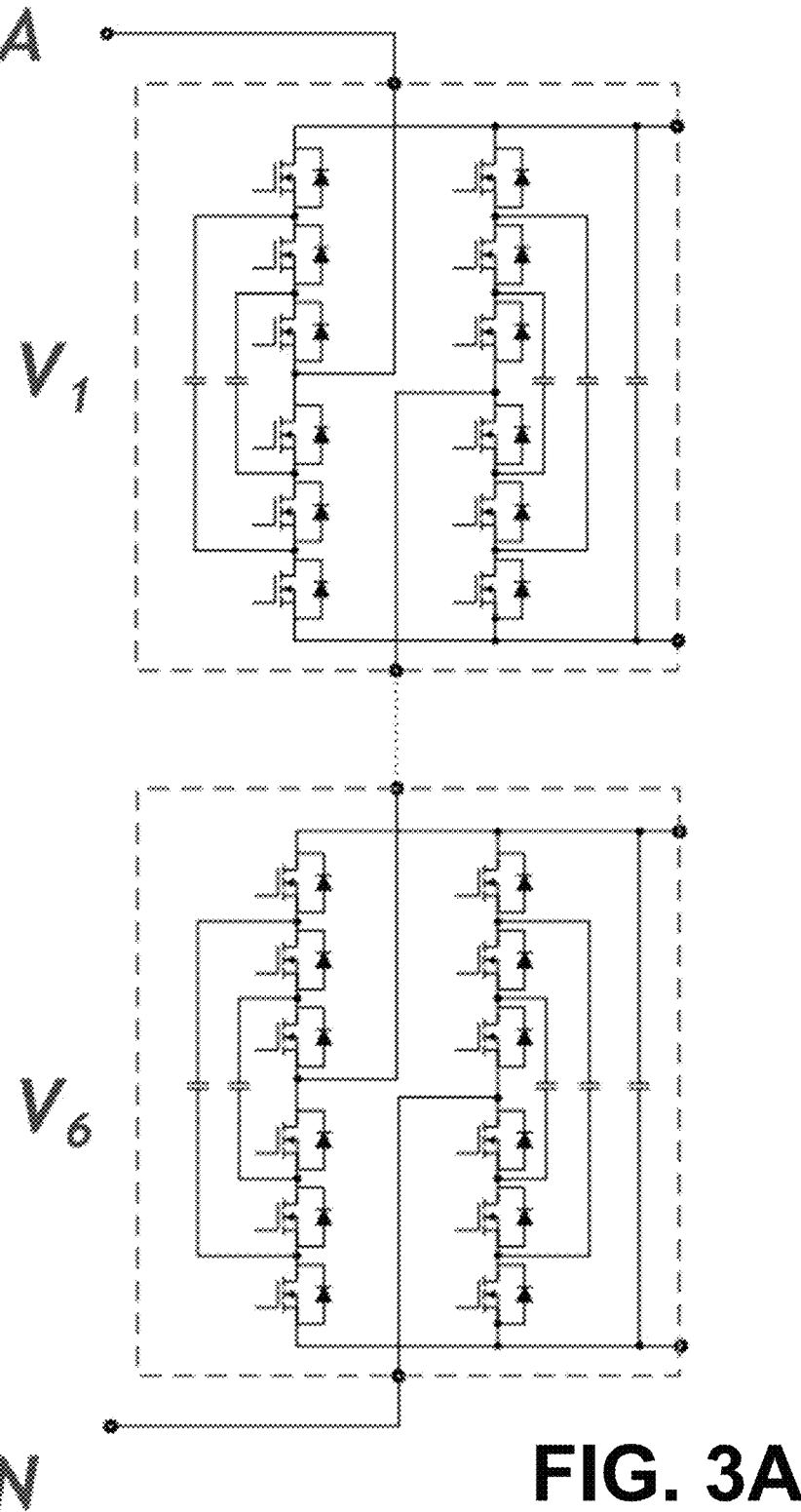
FIGS. 3A-3C illustrates an example of a cascaded-flying-capacitor multilevel active front end (AFE) topology, in accordance with various embodiments of the present disclosure.
Figures 3B, 3C:
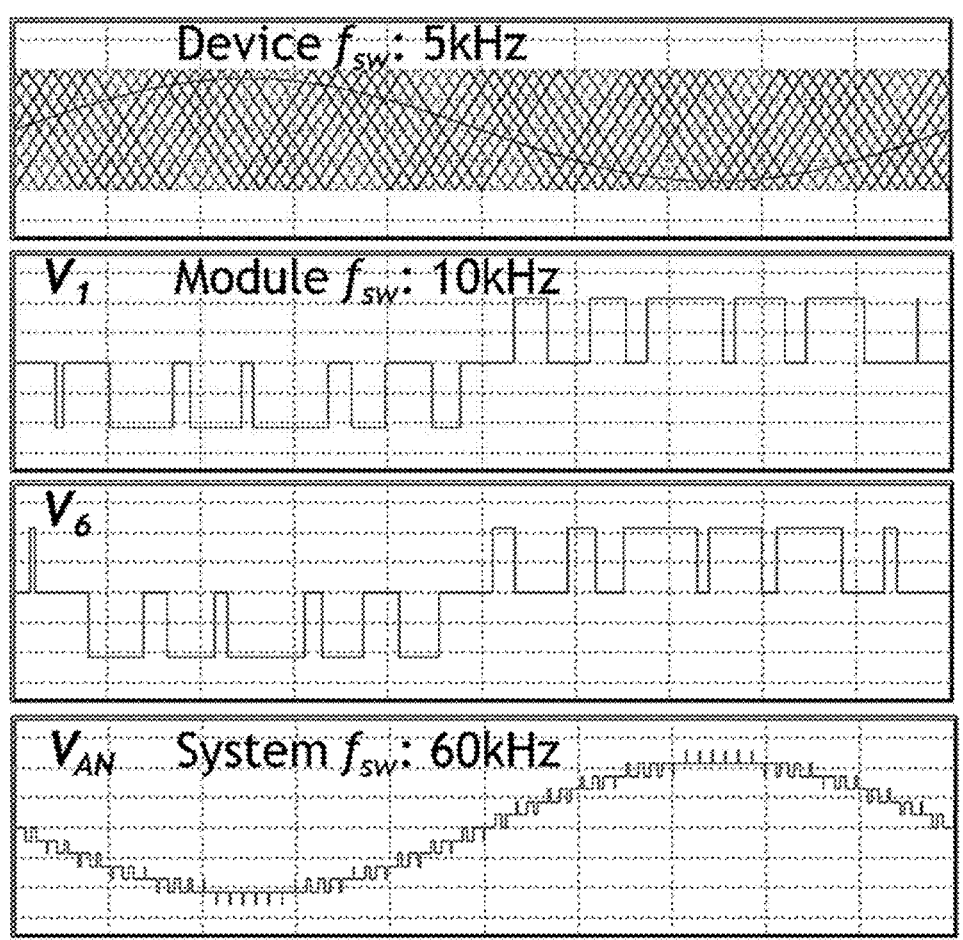

The module assembly can implement an active front end (AFE) topology. For example, a cascaded-flying-capacitor multilevel AFE can be implemented using the discrete switching devices 203 as shown in FIG. 3A. The cascaded-flying-capacitor multilevel AFE can provide higher DC-link voltage (e.g., 2.15 kV) with fewer isolation components. As shown in FIG. 3B, the cascaded-flying-capacitor multilevel AFE has 12X system versus device switching frequency (e.g., 5 kHz vs. 60 kHz), and produces a lower total harmonic distortion (allowing the use of a smaller filter). Use of 1.2 kV TO-247 SiC MOSFET devices can lower the cost of the module assembly. FIG. 3C is a table illustrating an example of cascaded-flying-capacitor multilevel AFE parameters.

Figure 4:
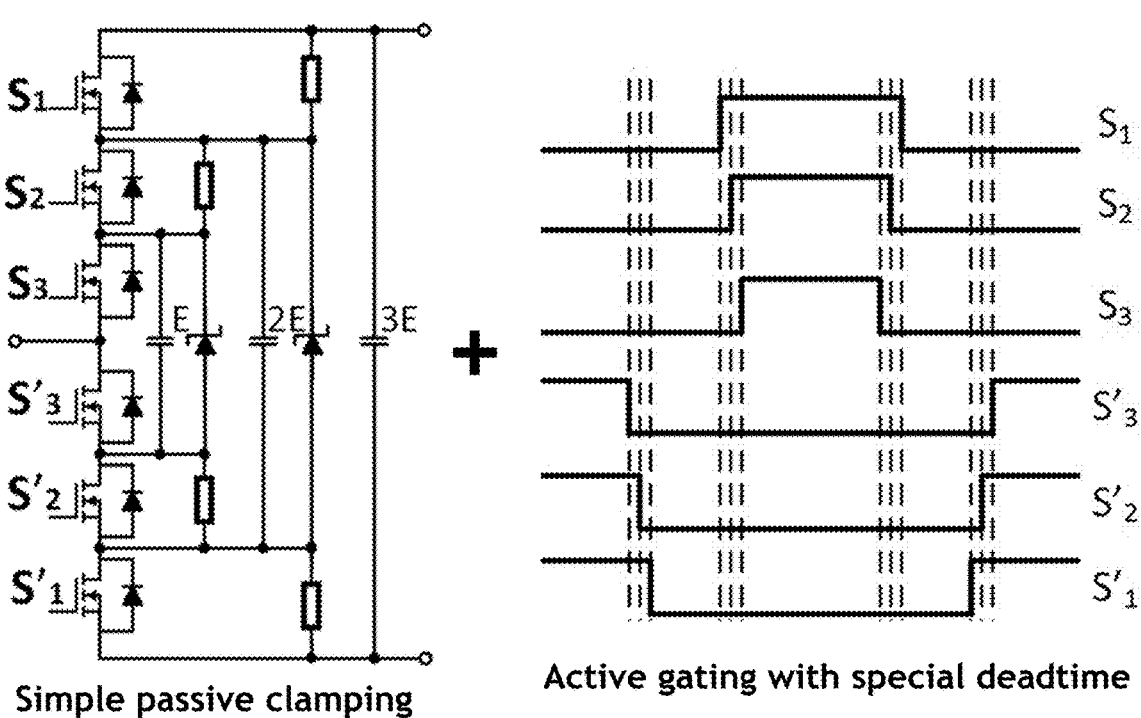
FIG. 4 illustrates an example of an integrated passive/active hybrid technology that can be utilized with the AFE topology of FIG. 3A, in accordance with various embodiments of the present disclosure.
Figure 4:
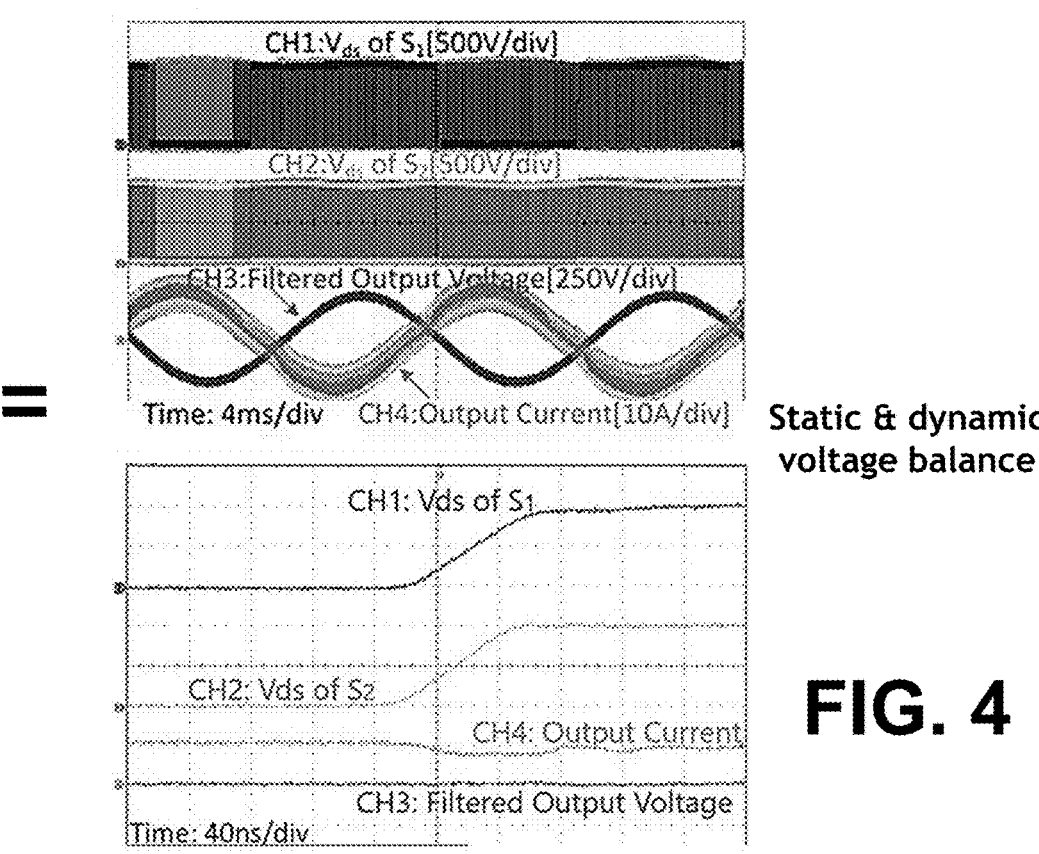

The AFE topology comprises an integrated passive/active hybrid technology. Combining a simple passive clamping circuit with active gating with special deadtime results in static & dynamic voltage balance. As shown in FIG. 4, this hybrid configuration results in negligible (0.01%) power loss of clamping devices. Compared to a passive solution, the hybrid solution has no full charge and discharge for capacitors and reduces power loss and size on clamping circuits significantly. The size of the clamping devices can be negligible (e.g., 68 nF capacitor with 2220 package, small TVS with DO-214 package, and 100 kOhm resistor with 2512 package). Compared to an active solution, the hybrid solution simplifies the gating sequence without need of voltage sensing. A standard gate driver can meet the requirement.

Figure 5A:
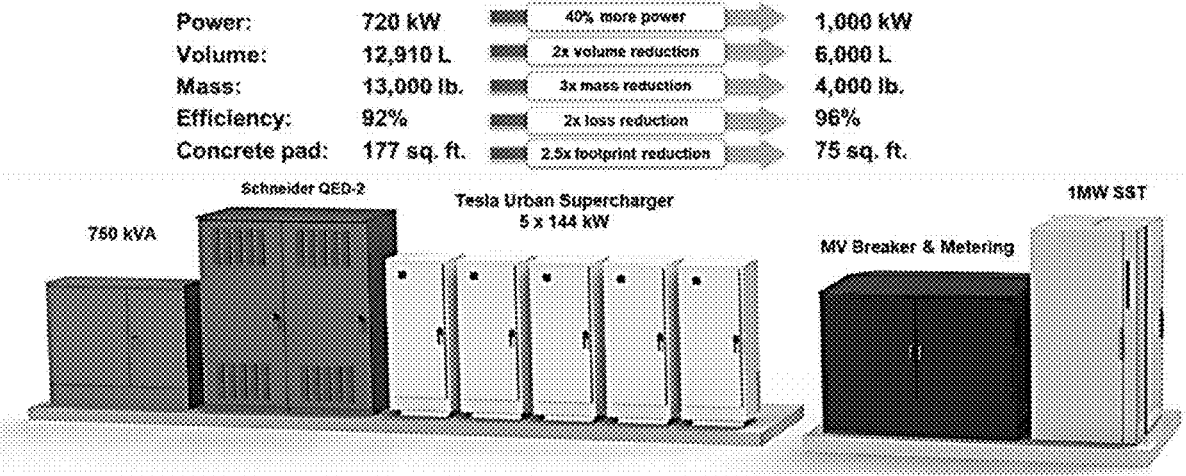
FIGS. 5A-5D illustrates an example of an extreme fast charger (EFC) comprising AFE and dual-active-bridge (DAB) implemented with half-bridge power modules of FIGS. 2A-2C, in accordance with various embodiments of the present disclosure.
Figure 5B:
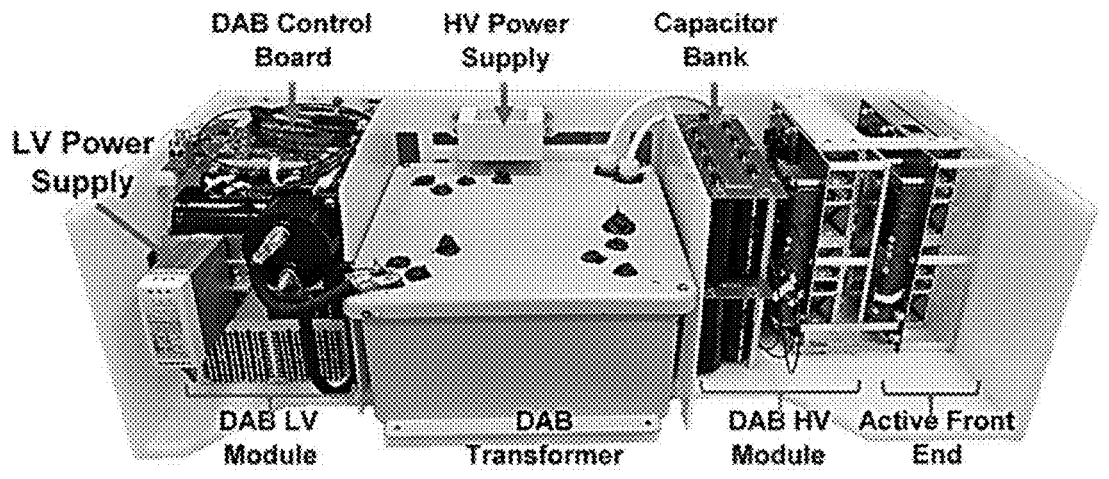

Referring next to FIG. 5A, shown are examples of 1 MW extreme fast charger (EFC) implementations, which can be used for EV extreme fast charging stations with a direct connection to a high voltage distribution network. As shown in FIG. 5A, use of the power module assembly of FIGS. 2A-2C in the 1 MW SST allows the EFC station to be reduced in size, with higher efficiency and lower cost. The 1 MW supercharger station (SST) has three phases. Each phase has six 55 kW power modules in series at the high voltage (HV) side and in parallel at the low voltage (LV) side. FIG. 5B shows an example of a submodule of the EFC. The disclosed technology is implemented at the active front end (AFE) as well as the dual-active-bridge (DAB) HV module, as shown in FIG. 5B.

Figure 5C:
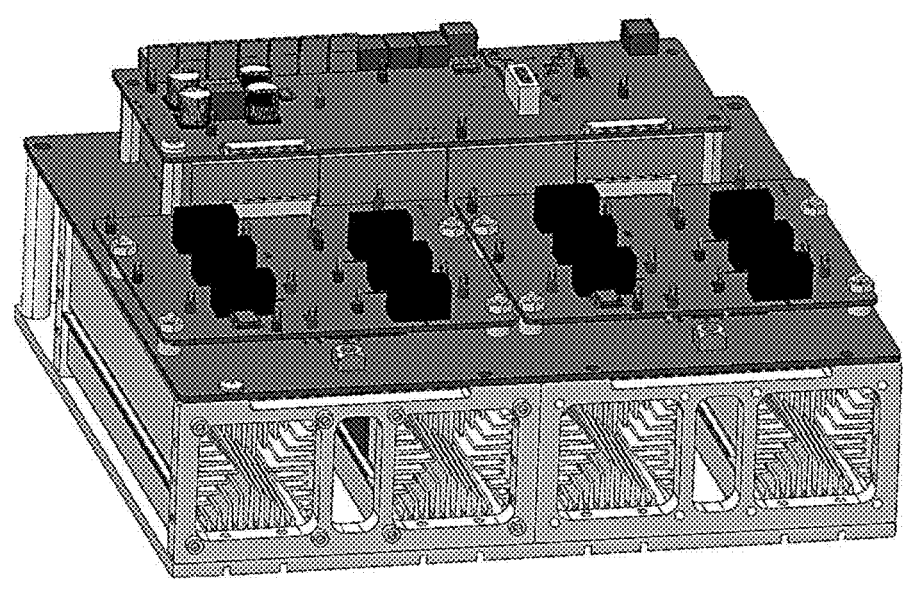
Figure 5D:
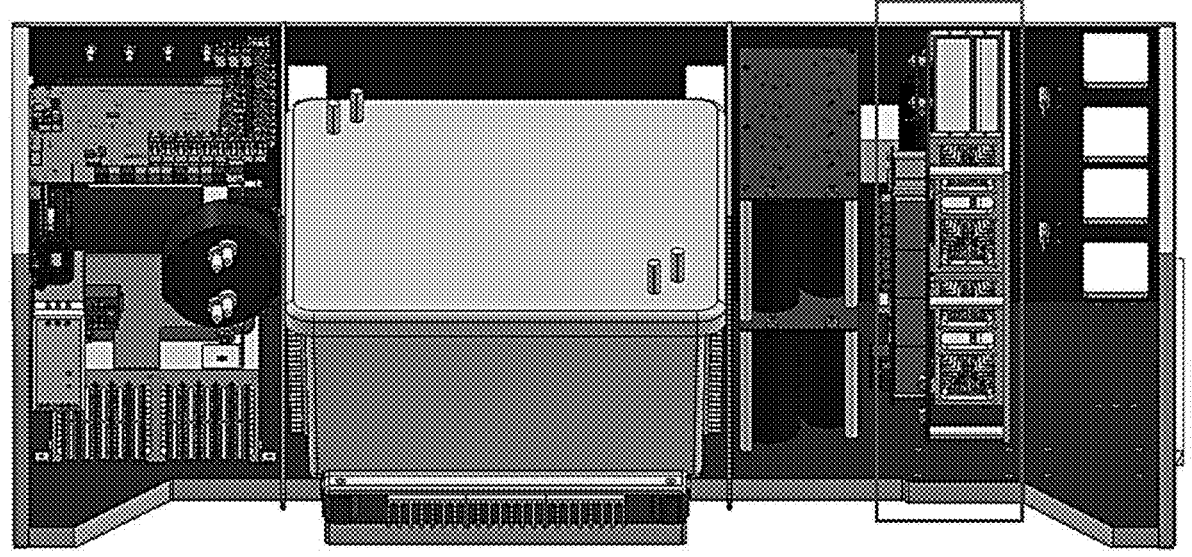

The AFE module converts the AC voltage and current into DC voltage and current using two half-bridges. FIG. 5C illustrates the AFE module including two half-bridge power module assemblies of FIGS. 2A-2C. The AFE can be implemented as a cascaded-flying-capacitor multilevel AFE of FIG. 3A. FIG. 5D shows the DAB module of the 55 kW module. The HV side of the DAB module inverts the DC voltage and current into high-frequency AC voltage and current. The DAB module comprises two half-bridges provided by two half-bridge power module assemblies of FIGS. 2A-2C. The half-bridge module design is the same as that in the AFE.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A module, comprising:
   a plurality of switching devices connected in series;
   one or more rubber buffer disposed between switching device pairs of the plurality of switching devices; and
   thermal interfaces disposed between switching devices of the switching device pairs and cooling surfaces of the module, the thermal interfaces electrically isolating the switching devices from the cooling surface.

2. The module of claim 1, wherein the thermal interfaces comprise an aluminum nitride (AlN) sheet or plate positioned between, and in contact with, at least one switching device and an adjacent cooling surface.

3. The module of claim 2, wherein the AlN sheet or plate is disposed between two or more switching devices and the adjacent cooling surface.

4. The module of claim 1, wherein the switching devices of the switching device pairs are not gated simultaneously.

5. The module of claim 4, wherein gating of the switching devices of the switching device pairs are separated by a controlled deadtime.

6. The module of claim 1, wherein the cooling surfaces are a cooling channel or a heatsink.

7. The module of claim 1, wherein the plurality of switching devices comprise HV MOSFETs.

8. The module of claim 1, wherein the switching devices of each switching device pair are separated by a corresponding rubber buffer.

9. The module of claim 1, wherein the plurality of switching devices are coupled to a passive clamping circuit.

10. An extreme fast charger (EFC) station, comprising:
    an active front end (AFE) module comprising at least one half-bridge power module comprising:
    a plurality of switching devices connected in series;
    one or more rubber buffer disposed between switching device pairs of the plurality of switching devices; and
    thermal interfaces disposed between switching devices of the switching device pairs and cooling surfaces of the module, the thermal interfaces electrically isolating the switching devices from the cooling surface;
    a dual-active-bridge (DAB) high voltage (HV) module;
    a DAB transformer; and
    a DAB low voltage (LV) module.

11. The EFC station of claim 10, wherein the AFE comprises a cascaded-flying-capacitor multilevel AFE.

12. The EFC station of claim 10, wherein the DAB HV module comprises at least one half-bridge power module comprising:

a plurality of switching devices connected in series;

one or more rubber buffer disposed between switching device pairs of the plurality of switching devices; and thermal interfaces disposed between switching devices of the switching device pairs and cooling surfaces of the module, the thermal interfaces electrically isolating the switching devices from the cooling surface.

13. The EFC station of claim 10, wherein the thermal interfaces of the at least one half-bridge power module comprise an aluminum nitride (AlN) sheet or plate positioned between, and in contact with, at least one switching device and an adjacent cooling surface.

14. The EFC station of claim 13, wherein the AlN sheet or plate is disposed between two or more switching devices and the adjacent cooling surface.

15. The EFC station of claim 10, wherein the switching devices of the switching device pairs are not gated simultaneously.

16. The EFC station of claim 15, wherein gating of the switching devices of the switching device pairs are separated by a controlled deadtime.

17. The EFC station of claim 10, wherein the cooling surfaces are a cooling channel or a heatsink.

18. The EFC station of claim 10, wherein the plurality of switching devices comprise HV MOSFETs.

19. The EFC station of claim 10, wherein the switching devices of each switching device pair are separated by a corresponding rubber buffer.

20. The EFC station of claim 10, wherein the plurality of switching devices are coupled to a passive clamping circuit.

* * * * *